United States Patent [19]

Brousseau

[11] Patent Number: 4,909,627
[45] Date of Patent: Mar. 20, 1990

[54] INTEGRATED-OPTICS IMPLEMENTATION OF AN INTERFEROMETRIC SPECTRUM ANALYSER

[75] Inventor: Nicole Brousseau, Nepean, Canada
[73] Assignee: Minister of National Defence, Canada
[21] Appl. No.: 254,928
[22] Filed: Oct. 7, 1988
[30] Foreign Application Priority Data
   Feb. 22, 1988 [CA] Canada ................... 559504
[51] Int. Cl.⁴ .................................. G01J 3/45
[52] U.S. Cl. ......................... 356/346; 342/192
[58] Field of Search .............. 356/346, 349; 342/56, 342/133, 146, 156, 192

[56] References Cited

U.S. PATENT DOCUMENTS 4,275,399  6/1981  Marom ........................ 342/192 X
4,779,984 10/1988  Cook ............................. 356/346

OTHER PUBLICATIONS

"High Dynamic-Range Interferometric Bragg-Cell Spectrum Analyser", J. Mellis, G. R. Adams & K. D. Ward, IEE Proceedings, vol. 133, Pt. J. No. 1, Feb. 86, pp. 26–30.
"Wide-Band Signal Processing Using the Two-Beam Acoustic Wave Acousto Optic Time Integrating Corrélator", M. W. Casseday, N. J. Berg, I. J. Abramovitz & J. N. Lee, IEEE Transactions on Sonics and Ultrasonics, vol. SU-28, No. 3, May 81, pp. 205–212.

Primary Examiner—Davis L. Willis
Assistant Examiner—Matthew W. Koren
Attorney, Agent, or Firm—Stevens, Davis, Miller & Mosher

[57] ABSTRACT

An improved interferometric spectrum analyser system with direction finding capabilities for an emitting source, the type having a holographic element to provide a laser beam source for the system. The laser beam from the source is focused on a light waveguide within which are arranged in asymetrical configuration with respect to the direction of the laser beam source a plurality of antenna signal transducers and a plurality of reference signal transducer, the antenna signal transducers and the reference signal transducers respectively being arranged in adjacent rows in such a manner as to provide acoustic signals propagating in the same direction within the transducer. A lens assembly is positioned with respect to the light waveguide so as to provide a one-dimensional Fourier transform signal on the X-axis of the waveguide by causing the mixing of the Fourier transform signal of the antenna signal and the Fourier transform signal of the reference signal. The analyser according to the present invention is more compact and less sensitive to vibration than currently available systems.

9 Claims, 3 Drawing Sheets

INTEGRATED-OPTICS IMPLEMENTATION OF AN INTERFEROMETRIC SPECTRUM ANALYSER

BACKGROUND OF THE INVENTION

This invention relates to a high dynamic range interferometric spectrum analyser with direction finding capabilities for use in determining the position and direction of movement of an object such as an airplane.

Optical spectrum analysers have many applications, particularly in electronic warfare. Electronic warfare systems are required to measure angle of arrival of threat emitters over a wide frequency bandwidth and a pulse by pulse basis in the presence of simultaneous signals. In order to obtain accurate angle of arrival, phase interferometric systems must be used. The present invention is related to such application. There are some optical spectrum analysers with direction finding capabilities presently available. The most common ones are the Multichannel Bragg cells and the Mach-Zehnder interferometric spectrum analysers. The Multichannel Bragg cells produce direction of arrival data on a y-axis of a Fourier plane through the interference of the light diffracted by the channels. The position of a spot of diffracted light on the x-axis is associated with the frequency of the signal and the position of the light pattern on the y-axis is associated with the direction of arrival of the signal.

There are some drawbacks associated with this type of application. In order to properly generate the direction of arrival data, the relative phase of the laser illumination of the channels is required to be precisely controlled. This precision and of the RF signals applied to the channels is difficult to achieve. Also the spacing of the antenna and of the channels of a Multichannel Bragg cell are proportional and could lead to excessive cross-talk between too closely spaced channels.

Mach-Zehnder type interferometric spectrum analysers give a dynamic range by mixing the spectra of a detected signal with the spectra of a reference signal. Both signals are fed into Bragg cells located in the arms of an inteferometric structure in such a way as to produce a frequency offset between the two spectra. The direction of arrival is obtained by comparing the phase of the beat signals produced by the element of each detector array that is activated by the incoming signal. The number of antennas to be utilized depends on the wavelength of the received signal and on the ambiguity that one is willing to tolerate in the direction of arrival data. The frequency of the signal is determined by the particular position, along the x-axis, of the activated elements.

The main drawbacks of such systems is that large systems are difficult to align and to keep aligned. Furthermore, such systems are very susceptible to problems due to vibration because of the size and the number of components involved.

It is an object of the present invention to provide a high dynamic range spectrum analyser with direction finding capabilities that will be more compact and more resistant to vibrations than those currently available.

SUMMARY OF THE INVENTION

In accordance with the present invention there is provided a interferometric spectrum analyzer system with direction finding capabilities for an object, the system having a holographic element to provide a laser beam source for the system. The improvement is characterized by light waveguide means, upon which the laser beam from the source is focused and within which are arranged in asymetrical configuration with respect to the direction of the laser beam a plurality of antenna signal transducers and a plurality of reference signal transducers. The antenna signal transducers and the reference signal transducers respectively are arranged in adjacent rows in such a manner so as to provide acoustic signals propagating in the same direction within the transducer. A lens assembly is positioned with respect to the single light waveguide means so as to provide a one-dimensional Fourier transform signal on the x-axis of the waveguide means by causing the mixing of the Fourier transform signal of the antenna signal and the Fourier transform signal of the reference signal. A detector comprising a plurality of detector elements is arranged in a plurality of linear array at the focal point of the cylindrical lens to detect the signals passing through the cylindrical lens and provide an output beat signal. An output signal processing means is provided for the processing of the beat signal from corresponding detector elements to provide data information to indicate the direction of the object.

The system in accordance with the present invention is more compact and less sensitive to vibration than those systems currently available using two separate Bragg cells.

BRIEF DESCRIPTION OF THE DRAWINGS

These and other objects and advantages of the invention will become apparent upon reading the following detailed description and upon referring to the drawings in which.

Figure 1:
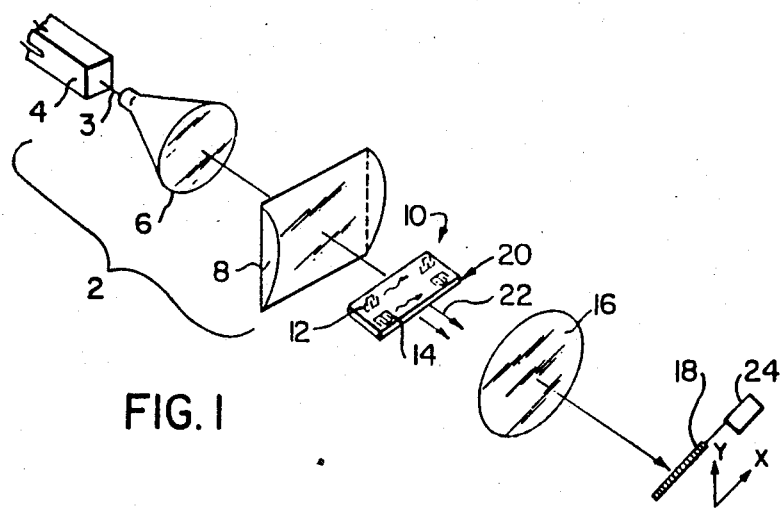
FIG. 1 is a schematic diagram of the component of an interferometric spectrum analyser system in accordance with the present invention.

While the invention will be described in conjunction with an example embodiment, it will be understood that it is not intended to limit the invention to such embodiment. On the contrary, it is intended to cover all alternatives, modifications and equivalents as may be included within the spirit and scope of the invention as defined by the appended claims.

DETAILED DESCRIPTION OF THE INVENTION

Similar features in the drawings have been given similar reference numerals.

Turning to FIG. 1 there is illustrated an integrated optical implementation of an interferometric spectrum analyser system in accordance with the present invention. The system consists of a laser beam generator 4 which generates a laser beam 3 passing through a beam expander 6 and then through a cylindrical lens 8. The converging laser beam 3 is then directed to an interferometric spectrum analyser chip 10 which consists of a waveguide 20. Two rows of transducers 12, 14 are mounted on the waveguide 20. Bragg cells are used as transducers 12, 14 in this invention. It is anticipated however that other devices may also be suitable for this purpose. The diffracted laser beam 22 passes through lens assembly 16 that performs a one-dimensional Fourier transform on the x-axis focused on a linear detector array 18 which is an array consisting of photo-detector elements. The lens assembly 16 also produces, on the y-axis, an image of the waveguide on the linear detector arrays 18 in order to concentrate the light diverging from the waveguide to facilitate detection. Outputs from the linear detector array 18 are coupled electronically to the output signal processor 24 which consists of a phase comparator unit 32 and a direction of arrival unit 34.

Figure 2:
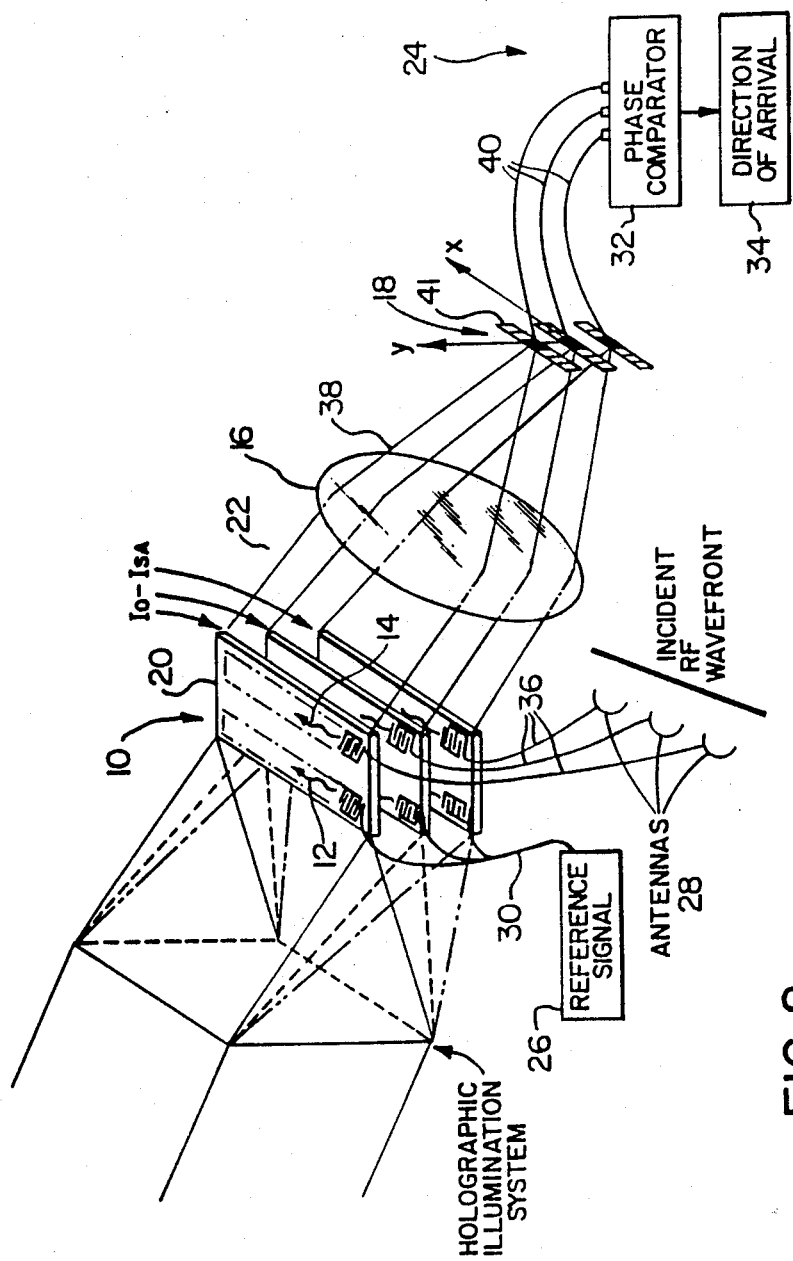
FIG. 2 is a schematic diagram of a system in accordance with FIG. 1.

FIG. 2 illustrates the implementation of an integrated optical interferometric spectrum analyser (IO-ISA) by the superposition of an appropriate number of interferometric spectrum analyser chips 10. The transducers for each chip 10 are arranged in rows 12, 14 such that one row of transducers 12 is coupled to the reference signal unit 26 and the second row of transducers is coupled to the RF antenna signals 36 from the antenna array 28. Each integrated optical interferometric spectrum analyser chip 10 processes the signal received by a particular element of one of the antenna arrays 28. The relative phase of the RF signals received by the element of the antenna array 28 varies according to the direction of arrival of the incoming signal. The reference signal unit 26 provides a common reference signal 30 for all the interferometric spectrum analyser chip 10. The reference signal 30 produces a time-invariant frequency spectrum over the system bandwidth. A linear chip waveform is used as a reference signal 30; however, other signals such as a comb of suitably spaced CW tones, and pseudo random noise sequences are also suitable.

A lens assembly 16 performs a one-dimensional Fourier transform on the x-axis that produces the spectral analysis of the incoming RF signals 36 and of the reference signal 30. The lens assembly 16 focuses the diffracted light 38 from the interferometric spectrum analyser chip 10 onto linear arrays of detectors 18. The lens assembly 16 also produces, on the y-axis, an image of the waveguides on the linear detector arrays 18 in order to concentrate to the light diverging from the waveguides to facilitate detection. The outputs of the detector arrays, electrical signals 40, are electronically coupled to the output signal processing unit 24.

Figure 3:
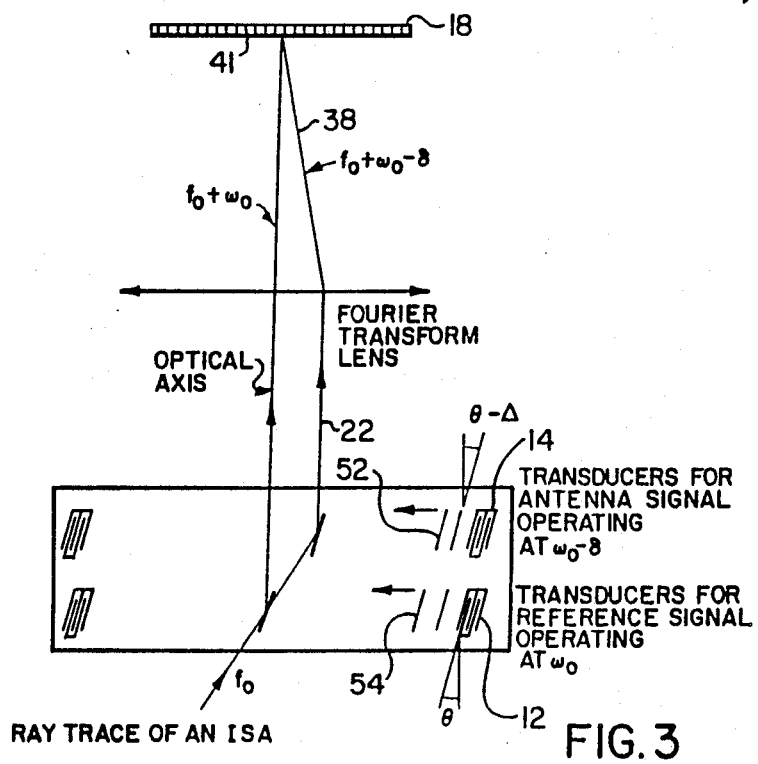
FIG. 3, on the first page of drawings, is a diagram showing the ray trace through an interferometric spectrum analyser in accordance with the present invention.

Turning to FIG. 3, there are shown transducers 12 for reference signal 30 and transducers 14 for RF signals 36. These are configured asymmetrically on a single light waveguide 20 such that the acoustic signals 52 and 54 generated by the RF signal 36 and the reference signal 30 propagate in the same direction. The transducers 12, 14 are oriented in such a way as to produce offset spectra in the Fourier plane. Accordingly, it is essential that one of the sets of transducers, in this case the antenna RF signal transducers 14, arranged at angle $(\theta+\Delta)$ or $(\theta-\Delta)$ from the optical axis, where $\theta$ is the Bragg angle. The added or subtracted angle ensures that each element 36 of the detector array 18 receives from the RF antenna signal transducer 14, a signal centered at a frequency $\delta$ and, from the reference signal transducer 12, a signal created at $w_o$, where:

$$\delta = \frac{v\Delta 2\pi}{\eta}$$

Note:
v = acoustic velocity of the surface acoustic wave
$\lambda$ = wavelength of the laser light used to operate the system.

The acousto-optical diffraction method used in the system of this invention employs a high interaction efficiency Bragg technique where the diffraction angle varies with the RF frequency as described in Freyre U.S. Pat. No. 4,390,247. The acoustic waves cause periodic variation in the refractive index in each cell through which the incident light beam passes. Acoustic frequency components of the propagating waves correspond to the signal frequency components and cause the cells to diffract the beams of incident coherent light and to frequency shift the diffracted beams. The relative phases of the acoustic frequency components of the acoustic waves also correspond to the phases of the frequency components of the delayed signal and are imparted to the diffracted light beams.

The frequency of the laser light 22 diffracted by the RF signal 36 and the reference signal 30 is shifted, through acousto-optical interaction, by the frequency of the acoustic wave involved in the interaction. Because the spectra generated by the specific orientation of the transducers 12, 14 are offset, the light diffracted by the RF signal 36 and the light diffracted by the reference signal 30 that reach a particular element 41 of the detector array 18 are not at the same frequency. Thus a beat signal is detected by the detector elements 18 and is equal to the difference of the frequencies of the two incident light beams. Accordingly, the mixing of the two signals produces an output signal 40 which is an IF signal at frequency w which is independent of the position on the linear detector array 18.

Figure 4:
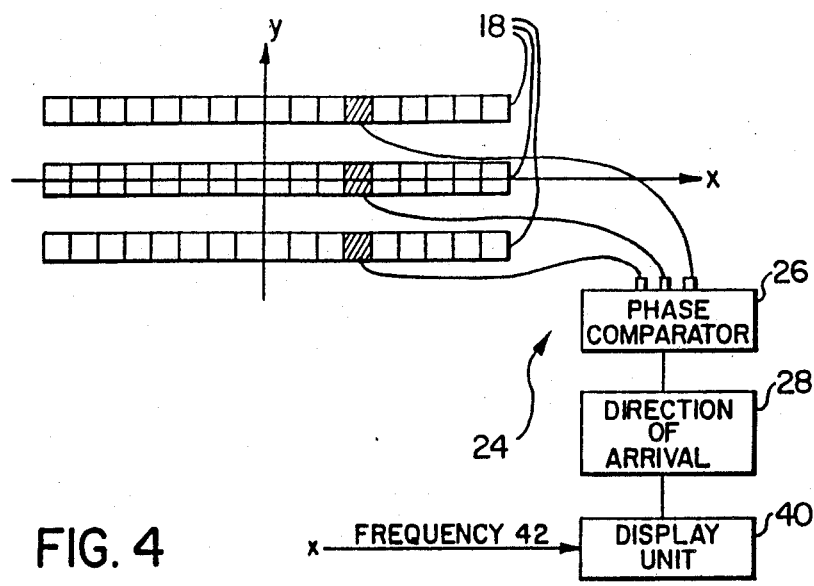
FIG. 4 is a schematic diagram showing an output interface for linear arrays of detectors of the system of FIG. 1.
Figure 5:
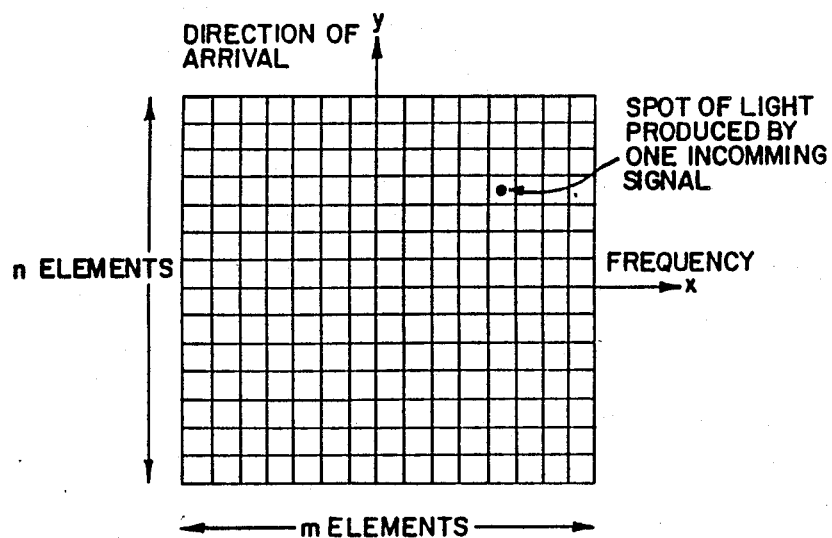
FIG. 5 is a diagram showing for comparison, an example display signal generated by a Multichannel Bragg cell.

In a multiple array arrangement, as illustrated in FIG. 2, the linear detector arrays 18 are positioned in such a way on the x-axis as to associate a particular distinctive frequency to the same element along the x-axis in each of the arrays 18, as shown in FIG. 4. The distance between the arrays on the y-axis is a matter of convenience and can be a function of the size of the package of the detector array and/or of the interferometric spectrum analyser chip 10.

Thus, by comparing the phase of the output signal 40 of each linear detector array 18, the angle-of-arrival of an airborne object can be accurately measured as sown in FIG. 4. The frequency information 42 is generated by the location of a spot of light on the x-axis in the Fourier plane.

Thus it is clear from the above description that the system of the present invention is not interferometric on the y-axis, it is interferometric on the x-axis. The angle-of-arrival is determined by the beat signals instead of being generated by an inteferometric process as in the prior art. Therefore, the present invention minimizes problems in the initial phase distribution arising from phase errors. Furthermore, the performance of the system of the present invention is independent of the distance between each inteferometric spectrum analyser chip 10. Therefore, cross-talk between each interferometric spectrum analyser chip 10 is minimized.

Thus it is apparent that there has been provided in accordance with the invention an interferometric spectrum analyser system that fully satisfies the objects, aims and advantages set forth above. While the invention has been described in conjunction with a specific embodiment thereof, it is evident that many alternatives, modifications and variations will be apparent to those skilled in the art in light of the foregoing description. Accordingly, it is intended to embrace all such alternatives, modifications and variations as fall within the spirit and broad scope of the invention.

The embodiments of the invention in which an exclusive property or privilege is claimed are defined as follows:

1. In an interferometric spectrum analyser system with direction finding capabilities for an object, having a holographic element to provide a laser beam source for the system, the improvement characterized by:
   (a) a light waveguide means, upon which the laser beam from the source is focused and within which are arranged in asymetrical configuration with respect to the direction of the laser beam a plurality of antenna signal transducers and a plurality of reference signal transducers, each said plurality of transducers respectively modulating the laser beam with signals propagating therethrough, the antenna signal transducers and the reference signal transducers respectively being arranged in adjacent rows in such a manner as to provide signals propagating in the same direction within the transducer, said antenna signal transducers receiving an antenna signal and said reference signal transducers receiving a reference signal;
   (b) a lens assembly positioned with respect to the light waveguide means so as to provide a one-dimenionsal Fourier transform signal on the x-axis of the waveguide means by causing the mixing of the Fourier transform signal of the laser beam modulated by said antenna signal and laser beam modulated by said reference signal;
   (c) a detector means comprising a plurality of detector elements arranged in a linear array at the focal point of the lens assembly to detect the signals passing through the lens assembly and provide an output beat signal; and
   (d) an output signal processing means for the processing of the beat signal to provide data information to indicate the direction of the object.

2. A system according to claim 1 further comprising a plurality of similar light waveguide means positioned in superposed fashion and wherein the detector means comprises a plurality of linear arrays of detector elements positioned in superposed fashion, each of said linear arrays corresponding to a similarly positioned one of said light waveguide means.

3. A system according to claim 2 wherein the linear arrays of detector elements are positioned in such a way on the x-axis of the Fourier plane as to associate a particular distinctive frequency to the corresponding element along the x-axis in each said array.

4. A system according to claim 1 wherein the transducers are surface-acoustic-wave Bragg cells.

5. A system according to claim 1 wherein the antenna signal transducers and the reference signal transducers are oriented in an asymetrical configuration at an angle relative to the optical axis of the cylindrical lens.

6. A system according to claim 1 wherein the antenna signal transducer and the reference signal transducer are oriented to produce an offset spectrum in a Fourier plane.

7. A system according to claim 1 further comprising antenna signal means arranged to provide antenna signals to the antenna signal transducers.

8. A system according to claim 1 further comprising reference signal generation means arranged to provide a common reference signal to the reference signal transducers.

9. A system according to claim 1 wherein the output signal processing means comprises a phase comparator means to be electronically associated with an object direction signal means whereby a signal is provided to indicate direction of movement of the object on the y-axis of the output plane.

* * * * *